United States Patent
Tada et al.

[11] Patent Number: 5,620,532
[45] Date of Patent: Apr. 15, 1997

[54] METHOD FOR MANUFACTURING $NB_3AL$ GROUP SUPERCONDUCTOR

[75] Inventors: Naofumi Tada, Ube; Fumio Iida, Hitachi; Ryukichi Takahashi, Hitachioota; Takaaki Suzuki, Katsuta, all of Japan

[73] Assignee: Hitachi, Ltd., Tokyo, Japan

[21] Appl. No.: 470,436

[22] Filed: Jun. 6, 1995

Related U.S. Application Data

[62] Division of Ser. No. 155,788, Nov. 23, 1993.

[30] Foreign Application Priority Data

Nov. 30, 1992 [JP] Japan ................................. 4-320279

[51] Int. Cl.$^6$ ................................................. H01B 13/00
[52] U.S. Cl. ................................... 148/98; 419/8; 419/29; 419/32; 419/33; 505/806; 505/807; 505/823
[58] Field of Search ........................ 419/8, 29, 32, 419/33; 148/514, 98; 75/352; 505/806, 807, 823

[56] References Cited

U.S. PATENT DOCUMENTS

| | | | |
|---|---|---|---|
| 3,723,092 | 3/1973 | Benjamin | 75/352 |
| 4,746,373 | 5/1988 | Yamada et al. | 148/903 |
| 4,836,849 | 6/1989 | Svedberg et al. | 75/245 |
| 5,504,984 | 4/1996 | Yamada et al. | 148/98 |

FOREIGN PATENT DOCUMENTS

| | | | |
|---|---|---|---|
| 03283321 | 12/1991 | Japan | 148/98 |
| 03283322 | 12/1991 | Japan | 148/98 |
| 04129107 | 4/1992 | Japan | 148/98 |
| 04298914 | 10/1992 | Japan | 148/98 |
| 05325677 | 12/1993 | Japan | 148/98 |
| 600407 | 6/1994 | Japan | 148/98 |
| 1675062 | 9/1991 | U.S.S.R. | 75/352 |
| 1162635 | 8/1969 | United Kingdom | 148/98 |

OTHER PUBLICATIONS

Charles E. Lundin and Albert S. Yamamoto "The Equilibrium Phase Diagram", Niobium (Columbium)–Aluminum Trans Met Soc AIME (236), pp. 863–872.

ASM Handbook vol. 7 Jun. 1984, pp. 636–638.

*Primary Examiner*—David A. Simmons
*Assistant Examiner*—Margery S. Phipps
*Attorney, Agent, or Firm*—Antonelli, Terry, Stout & Kraus, LLP

[57] ABSTRACT

In a method for manufacturing $Nb_3Al$ phase by a diffusion reaction of $Nb_2Al$ phase and Nb phase, a part of the $Nb_2Al$ phase is remained and dispersed in the $Nb_3Al$ phase homogeneously as for magnetic flux pinning centers for a high magnetic field. As for a method for dispersing the $Nb_2Al$ phase homogeneously, a $Nb_3Al$ group superconducting precursory composition obtained by dispersing Nb particles and $Nb_2Al$ ultrafine particles by a mechanical alloying method is used, and further, by a conventional method for generating $Nb_3Al$ phase by a diffusion reaction of Nb and an aluminum alloy, A $Nb_3Al$ group superconductor can be achieved.

4 Claims, 2 Drawing Sheets

5,620,532

METHOD FOR MANUFACTURING NB₃AL GROUP SUPERCONDUCTOR

This is a division of application Ser. No. 155,788 filed Nov. 23, 1993.

BACKGROUND OF THE INVENTION (1) Field of the Invention

The present invention relates to $Nb_3Al$ group superconductors, particularly, to $Nb_3Al$ group superconductors and manufacturing method thereof, $Nb_3Al$ group superconductive precursory compositions, and superconducting magnets for generating high magnetic field preferable for nuclear fusion apparatus, nuclear magnetic resonance apparatus, and high magnetic field generating apparatus all of which require high magnetic field.

(2) Description of the Prior Art $Nb_3Al$ group superconductors have been manufactured, as described in Applied Physics Letters, vol. 52 No. 20 p1724–1725 (1988. 5.16), in a manner that a plurality of aluminum alloy core materials and niobium matrix material are made to an ultrafine multicore cable by a composite manufacturing method, and subsequently, the cable is treated with diffusion heat treatment at 750°–950° C.

Another manufacturing method in which $Nb_2Al$ powder and Nb powder are mixed, fabricated, and sintered at 1,300°–1,400° C. to be $Nb_3Al$ is disclosed in The Proceedings of 45th on Cryogenics and Superconductivity (Chiba, Japan, May 14–16, 1991), p246.

Further, other manufacturing method is disclosed in JP-A-3-283322 (1991), in which a composite body is formed by filling mixed powder of $Nb_2Al$ alloy and niobium into a metallic tube made from niobium or Nb base alloy, a core material is formed by cold working of the composite body, and subsequently, $Nb_3Al$ superconductor is obtained by heat treatment of the core material for generating $Nb_3Al$ which changes the cold worked powder to $Nb_3Al$.

Among the above described prior art, the composite manufacturing method had a problem that the $Nb_3Al$ ultrafine multicore cable obtained by normal diffusion heat treatment had low critical temperature and low critical magnetic field, and the critical current density decreased remarkably under a high magnetic field condition such as 20 T level. The method by fabrication and sintering of $Nb_2Al$ powder and Nb powder necessitated sintering at high temperature, and accordingly, it had a problem although it enhanced yielding of $Nb_3Al$ that crystal grain size of $Nb_3Al$ increased and the critical current density decreased under low and medium magnetic field conditions.

That means, a case of $Nb_3Al$ group superconductors, high critical temperature and high critical magnetic field depending on characteristics of $Nb_3Al$ material itself can not be realized, and accordingly, the critical current density under a high magnetic field condition is low, and the $Nb_3Al$ superconductors do not become cable materials for practical use. Generally speaking, it is well known that the critical current density of $Nb_3Al$ group superconductor depends on size of the crystal grain, although a $Nb_3Al$ superconducting phase by the above described conventional composite manufacturing method includes fine crystal grains and many magnetic flux pinning centers which are effective under a relatively low magnetic field condition, the $Nb_3Al$ group superconductors have low critical current density under a high magnetic field condition because of shifting the composition ratio of niobium and aluminum etc.

Further, it is well known that $Nb_2Al$ non-superconductive phase acts as an effective magnetic flux pinning center under a high magnetic field. However, the conventional diffusion reaction of niobium and aluminum generates aluminum enriched $NbAl_3$ phase first in accordance with thermal equilibrium, and subsequently generates $Nb_2Al$ phase and superconductive $Nb_3Al$ phase through $Nb_2Al$ phase. Therefore, a great effort is devoted to form $Nb_3Al$ single phase, but $Nb_2Al$ non-superconductive phase does not exist in the single phase.

Further, various methods for generating only superconductive $Nb_3Al$ phase having a large amount of grain boundaries which are magnetic flux pinning centers in $Nb_3Al$ phase, that means fining the grain size, have been attempted, but any method has not succeeded. Moreover, a method in which a diffusion reaction is performed at high temperature with $Nb_2Al$ phase and niobium as starting materials was proposed. But, although the proposed method relatively facilitates formation of $Nb_3Al$ phase, grain size remains still large.

The method disclosed in JP-A-3-283322 (1991) neither indicate any improvement on critical current density under a high magnetic field condition, nor any special consideration on a relationship between the $Nb_2Al$ non-superconductive phase and the magnetic flux pinning centers under a high magnetic field condition.

SUMMARY OF THE INVENTION (1) Objects of the Invention

One of the objects of the present invention is to provide $Nb_3Al$ group superconductors having high critical current density under high magnetic field condition such as 20 T level and manufacturing method thereof, $Nb_3Al$ group superconductive precursory compositions, and superconducting magnets for generating high magnetic field.

Another object of the present invention is to provide $Nb_3Al$ group superconductors having high critical current density under a whole condition from low magnetic field to high magnetic field and manufacturing method thereof, $Nb_3Al$ group superconductive precursory compositions, and superconducting magnets for generating high magnetic field.

(2) Methods of solving the Problems

In order to achieve the above objects, the present invention provides a composition wherein $Nb_2Al$ phase is dispersed in $Nb_3Al$ phase in the $Nb_3Al$ group superconductors generated by a diffusion reaction of $Nb_2Al$ and Nb or Nb alloys. Preferable structure for improving the critical current density under a high magnetic field condition in the above method is such that a grain size of the $Nb_2Al$ phase is utmost 0.1 µm in average diameter and an interval between each grain is in a range of 0.01–0.1 µm.

In order to obtain the $Nb_3Al$ group superconductors having the above described composition and structure, a method wherein Nb particles and $Nb_2Al$ fine particles are dispersed and mixed each other by a mechanical alloying method is preferable because the method makes it possible to obtain large amount of the $Nb_3Al$ group superconductive precursory compositions having a most homogeneously dispersed structure. That means, dispersing $Nb_2Al$ fine particles having utmost 0.1 µm in average diameter in Nb particles having 1–100 µm in average diameter by the mechanical alloying method enables the hard $Nb_2Al$ fine particles be dispersed in relatively soft Nb particles homogeneously.

Further, in order to obtain a superconductor having a large current carrying capacity for practical use, it is preferable to perform a deformation processing on the above $Nb_3Al$ group superconductive precursory composition with deformation ratio at least 1000, and subsequently, to treat by a diffusion reaction at 1,000°–1,800° C.

Besides, the $Nb_3Al$ group superconductors having an electro-magnetically stable multifilamentary structure can be obtained by deformation processing of the $Nb_3Al$ group superconductive precursory composition to tubular or linear shapes, subsequent deformation processing for composing with Al alloy matrix, and a diffusion reaction.

In the present invention, the $Nb_3Al$ group superconductors can have high critical current densities in a whole region from a low magnetic field to a high magnetic field by artificially controlling and using substantially two kinds of different magnetic flux pinning centers.

In accordance with the present invention, a part of $Nb_2Al$ phase and niobium phase remain without reacting each other although the $Nb_2Al$ phase and the niobium phase are used as starting materials and the remained $Nb_2Al$ phase has a function as a magnetic flux pinning center under a high magmatic field. That means, in a chemical reaction expressed by the following equation, all of reactants are not necessarily converted to $Nb_3Al$ phase but a part of which remain as $Nb_2Al$ phase which disperses in $Nb_3Al$ phase of the $Nb_3Al$ group superconductor by terminating the reaction before completing the reaction;

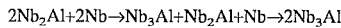

Accordingly, the objects of the present invention can be achieved by the diffusion reaction of lower temperature and shorter time than that of the reaction for converting all of the reactants to $Nb_3Al$ phase.

In the present invention, it was revealed experimentally that the structure wherein a grain size of the $Nb_2Al$ phase dispersed in the $Nb_3Al$ phase has utmost 0.1 μm in diameter and an interval between each grain is in a range of 0.01–0.1 μm is significantly preferable state for making the $Nb_2Al$ phase have a function as magnetic flux pinning center under a high magnetic field condition. Because of remarkable difficulty in dispersing $Nb_2Al$ phase in $Nb_3Al$ phase homogeneously by conventional powder metallurgy, a mechanical alloying method wherein $Nb_2Al$ fine particles having utmost 0.1 μm in diameter are dispersed in Nb particles having 1–100 μm in diameter was adopted in the present invention. As a result, it became possible to disperse the particles homogeneously in a form that a plurality of the $Nb_2Al$ fine particles 2 bite into the Nb particle 1 as shown in FIG. 2 because of softness of the Nb particle. Further, it was confirmed that the Nb particle was crushed by the subsequent fabrication.

By performing a deformation processing on the $Nb_3Al$ group superconductive precursory composition obtained by the above described manner with deformation ratio at least 1000, and subsequent treating by a diffusion reaction at 1,000°–1,800° C., the $Nb_3Al$ group superconductor was obtained wherein a part of respective $Nb_2Al$ phase 2 and Nb phase 1 reacts to generate $Nb_3Al$ 3 phase, and the $Nb_2Al$ phase 2 is homogeneously dispersed in the $Nb_3Al$ phase 3 as schematically shown in FIG. 1.

As explained above, the present invention generates $Nb_3Al$ phase at lower temperature than that of the conventional method. Accordingly, the $Nb_3Al$ phase acts as magnetic flux pinning centers under a low magnetic field condition, and the $Nb_2Al$ phase dispersing homogeneously in the $Nb_3Al$ phase acts effectively as magnetic flux pinning centers under a high magnetic field condition. As for the Nb phase, Nb alloys can be used in a range that the above reaction is not disturbed.

Further, a conventional reaction of niobium or Nb alloys with aluminum or Al alloys to generate $Nb_3Al$ as expressed by the following equation can be superimposed to the above reaction effectively in practical use;

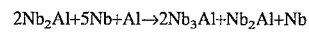

DETAILED DESCRIPTION OF THE EMBODIMENTS

The embodiments of the present invention are explained hereinafter referring to figures in comparison with the prior art. But the present invention is not restricted by the embodiments.

Embodiment 1

Figure 1:
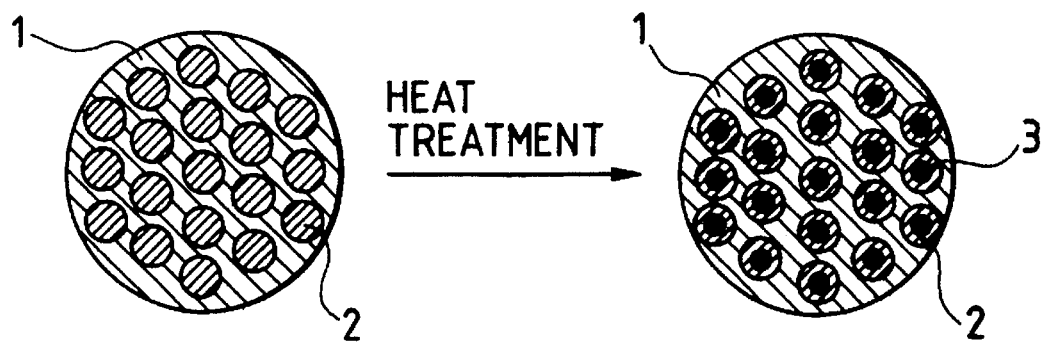
FIG. 1 is a schematic cross section of the $Nb_3Al$ group superconductor for explaining a structure of the present invention.
Figure 2:
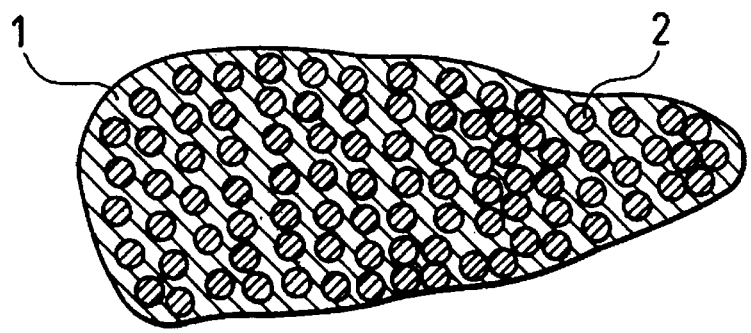
FIG. 2 is a schematic cross section of the $Nb_3Al$ group superconductive precursory composition for explaining a structure of the present invention.

Niobium powder having about 50 μm in diameter and $Nb_2Al$ fine powder which was obtained by arc-melting and pulverizing to 0.07 μm in average diameter were mixed by approximately 1:1, and the mixed powder was converted to integrated powder by a mechanical alloying method using a high energy ball milling in an inert gas atmosphere. The integrated powder had a cross section shown in FIG. 2 in which a plurality of hard $Nb_2Al$ fine powder 2 were dispersed homogeneously in the soft and large Nb particle 1, and the Nb particle was deformed to a flat shape by a large plastic deformation.

Next, the integrated powder, that is the $Nb_3Al$ group superconductive precursory composition, was put into a tube made from niobium having 11.0 mm in outer diameter and 7.0 mm in inner diameter and sealed hermetically. Then, the tube was drawn to be wire having 1.0 mm in outer diameter for obtaining composite multicore cables. Deformation ratio (decreasing fraction of cross sectional area) at the time was about $5\times10^4$. Subsequently, the wire was heated at 1,200° C. for 30 minutes for diffusion reaction to be $Nb_3Al$ group superconductor, and then, copper was plated on surface of the wire for about 10 μm thick.

Subsequently, samples were cut out from the superconductor, critical temperatures were measured under various temperatures by a resistive method, and critical currents were measured under various magnetic fields at 4.2K.

Figure 3:
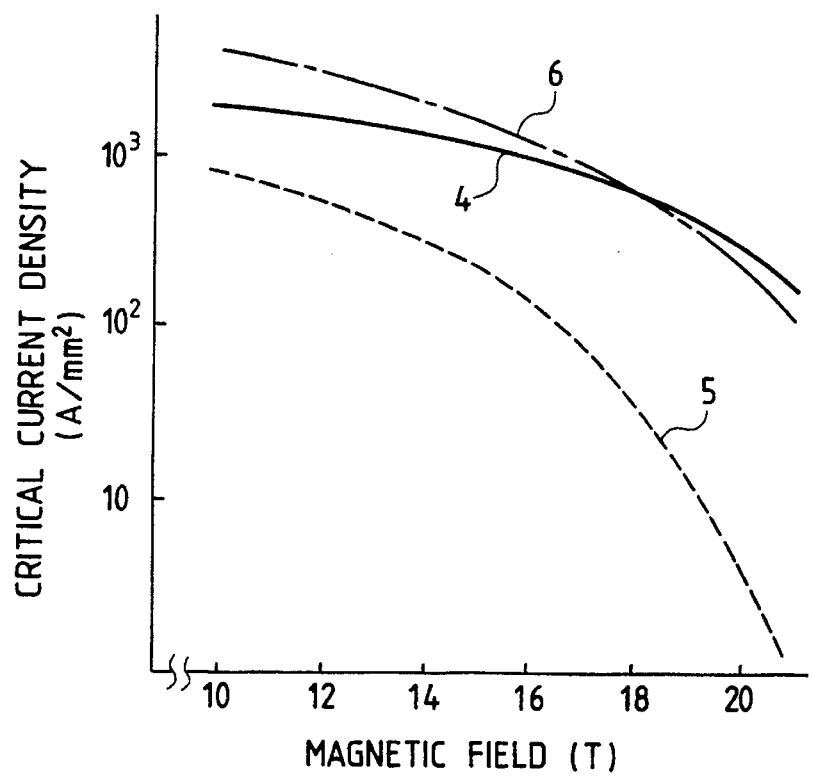
FIG. 3 is a graph showing a magnetic field/critical current density characteristics at 4.2K of the $Nb_3Al$ group superconductor manufactured by the prior art and the present invention.

As for the critical temperature, 17.9K at middle point temperature was obtained, and it revealed that the superconductor manufactured by the present invention could be improved by 2.3K in comparison with 15.6K of the $Nb_3Al$ conductor manufactured by the conventional composite manufacturing method. The critical current was taken as the current at a point when the voltage 1 μV/cm was generated, and the critical current density was calculated by per cross sectional area without copper stabilizing material. The result is shown in FIG. 3. The curve line 4 in FIG. 3 indicates magnetic field of the present embodiment/critical current density characteristics, and the curve line 5 indicates magnetic field of Nb$_3$Al ultrafine multicore material by the conventional composite manufacturing method/critical current density characteristics. As the figure reveals, the superconductor obtained by the method of the present invention has higher critical current densities than that obtained by the conventional method, especially at high magnetic field in a range higher than 15–16 T. For instance, in a magnetic field of 20 T, the superconductor of the present invention is the Nb$_3$Al superconductor for high magnetic field having almost 1000 times critical current density in comparison with that of the prior art.

Embodiment 2

Nb$_3$Al group superconducting precursory composition prepared by dispersing and mixing of Nb particles and Nb$_2$Al fine particles by the mechanical alloying method as same as the embodiment 1 was used for manufacturing composite single core wire by fabricating a hollowed cylinder having 11.0 mm O.D. and 7.0 mm I.D., inserting an alloy rod of Al—Mg 5 atomic per cent having 6.5 mm in diameter into the above hollowed cylinder, and drawing to be a wire having 3.0 mm O.D. Subsequently, a composite multicore wire was manufactured by bundling 37 of the above composite single core wires, inserting the bundle into a hollowed niobium cylinder having 25.5 mm O.D. and 21.5 mm I.D., and drawing to be a wire having 1.0 mm O.D. A deformation ratio of the drawing was about $8\times10^3$. And, a diameter of the Al—Mg 5 atomic per cent core material (matrix) was about 70 μm. Subsequently, after the above wire was treated at 1,200° C. for 30 minutes for a diffusion reaction to be the Nb$_3$Al group superconductor, copper was plated on surface of the wire for about 10 μm thick, and further a heat treatment at 850° C. for 50 hours in vacuum was performed.

As same as the embodiment 1, critical temperatures and magnetic field/critical current density characteristics of samples were measured. The result of the measurement revealed that the critical temperature was 17.5K, somewhat lower than that of the embodiment 1, and, as for the magnetic field/critical current density characteristics, large critical current densities were obtained in a range of magnetic field less than 18 T as shown by the curve line 6 in FIG. 3. This is because of yielding Nb$_3$Al phase which is generated by a reaction of Nb phase and Al—Mg alloy matrix phase in addition of Nb$_3$Al phase which is generated by a reaction of Nb phase and Nb$_2$Al phase.

Consequently, in comparison with the superconductor of the prior art shown by the curve line 5 in FIG. 3, the superconductor of the present invention was improved remarkably on the critical current density in a whole range of the magnetic field.

Embodiment 3

Nb$_3$Al group superconducting precursory composition prepared by dispersing and mixing of Nb particles and Nb$_2$Al fine particles by the mechanical alloying method as same as the embodiment 1 was used for manufacturing composite single core wire by fabricating a rod having 6.5 mm O.D., inserting the above rod into a hollowed cylinder of Al—Mg 5 atomic per cent alloy having 11.0 mm O.D. and 7.0 mm I.D., cladding outer surface of the hollowed cylinder with a niobium tube, and drawing to be a wire having 3.0 mm O.D. Subsequently, a composite multicore wire was manufactured by bundling 37 of the above composite single core wires, inserting the bundle into a hollowed niobium cylinder having 25.5 mm O.D. and 21.5 mm I.D., and drawing to be a wire having 1.0 mm O.D. Subsequently, after the above wire was treated at 1,200° C. for 30 minutes for a diffusion reaction to be the Nb$_3$Al group superconductor, copper was plated on surface of the wire for about 10 μm thick, and further a heat treatment at 850° C. for 50 hours in vacuum was performed.

The result of measurement of critical temperatures and critical current densities on the samples revealed similar characteristics with those of the embodiment 2, and, in comparison with the superconductor of the prior art, the superconductor of the present invention was improved remarkably on the critical current density in a whole range of the magnetic field.

Embodiment 4

Nb$_3$Al group superconducting precursory composition prepared by dispersing and mixing of Nb particles and Nb$_2$Al fine particles by the mechanical alloying method as same as the embodiment 1 was used for manufacturing a composite wire by fabricating a plate, rolling the plate to be a foil of 0.1 mm thick, rolling an Al—Mg 5 atomic per cent alloy to be a foil of 0.1 mm thick, laminating the above two kinds of foils, winding up the laminate to be a roll so that the cross section forms a spiral, inserting the roll into a niobium tube having 25.5 mm O.D. and 21.5 mm I.D. and drawing the above tube to be the composite wire having 1.0 mm in diameter.

Subsequently, after the above wire was treated at 1,200° C. for 30 minutes for a diffusion reaction to be the Nb$_3$Al group superconductor, copper was plated on surface of the wire for about 10 μm thick, and further a heat treatment at 850° C. for 50 hours in vacuum was performed.

The result of measurement of critical temperatures and critical current densities on the samples revealed similar characteristics with those of the embodiment 2, and, in comparison with the superconductor of the prior art, the superconductor of the present invention was improved remarkably on the critical current density in a whole range of the magnetic field.

Embodiment 5

Figure 4:
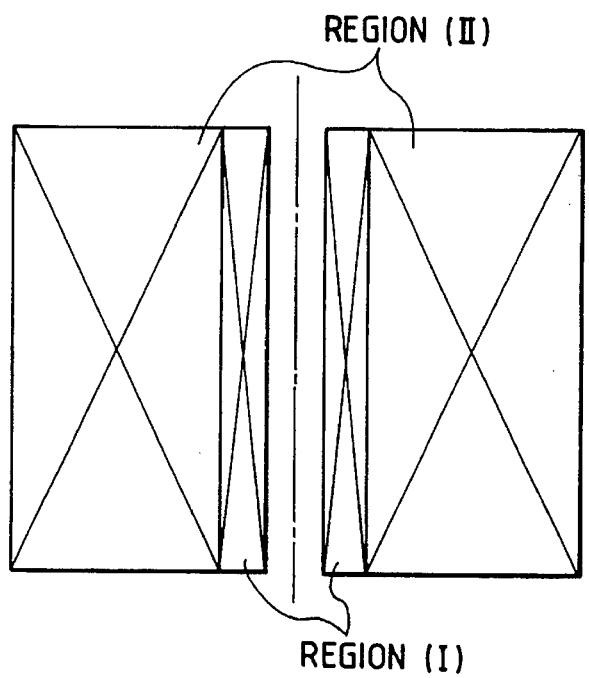
FIG. 4 is a schematic cross section of a superconducting coil for explaining a structure of the present invention.

A Nb$_3$Al superconductor of 0.25 mm thick and 5.0 mm wide was manufactured in accordance with the method explained in the embodiment 2, and was wound tightly in the region (I) of the hollowed cylindrical superconductor such as shown in FIG. 4. A conventional (Nb, Ti)$_3$Sn ultrafine multicore superconductor was wound tightly in the region (II) as well. The above superconducting coil was a bobbin, in which the coil in the region (I) was 50 mm I.D., 130 mm O.D., and 400 mm in axial length, and the coil in the region (II) was 130 mm I.D., 500 mm O.D., and 400 mm in axial length. The region (I) and (II) were electrically connected in a series, and were energized in liquid helium by a power source.

As a result, a magnetic field of 19.5 T could be generated at the center region of the coil. If the region (I) was also wound by the conventional (Nb, Ti)$_3$Sn ultrafine multicore superconductor, the maximum magnetic field at 4.2K was about 17 T, and accordingly, it was revealed that the present invention could increase remarkably the magnetic field generated by the superconductor with a coil having a same cross section area. Further, it can be said a significant technical advantage that such a high magnetic field as ever been achieved at 4.2K can be achieved by the present invention.

As above explained, the present invention makes it possible to generate a high magnetic field such as 20 T level at 4.2K, which has never been achieved with a superconducting magnet, with a more compact apparatus than ever economically. Further, as the present invention uses Nb$_3$Al group superconductor having high current density in a whole magnetic field from low to high magnetic fields, winding can be performed with only single kind of superconductor, and accordingly, the winding is relatively facilitated. Moreover, becoming it possible to generate a high magnetic field with only the $Nb_3Al$ group superconductor can solve instantly a problem of induced radioactivity in a nuclear fusion apparatus of a magnetic confinement type, and its advantage is remarkable.

What is claimed is:

1. A method for manufacturing $Nb_3Al$ group superconductor comprising the steps of;

dispersing and mixing Nb particles and $Nb_2Al$ ultrafine particles by a mechanical alloying method thereby obtaining a $Nb_3Al$ group superconducting precursory composition, deforming said $Nb_3Al$ group superconducting precursory composition with a deforming ratio at least 1,000, and subsequently, performing a diffusion reaction at 1,000°–1,800° C.

2. A method for manufacturing $Nb_3Al$ group superconductor comprising the steps of;

dispersing and mixing Nb particles and $Nb_2Al$ ultrafine particles by a mechanical alloying method thereby obtaining a $Nb_3Al$ group superconducting precursory composition, fabricating said $Nb_3Al$ group superconducting precursory composition to a hollowed cylinder, inserting an aluminum alloy into said hollowed cylinder, deforming said hollowed cylinder with said inserted aluminum alloy, and subsequently performing a diffusion reaction at 1000°–1800° C.

3. A method for manufacturing $Nb_3Al$ group superconductor comprising the steps of;

dispersing and mixing Nb particles and $Nb_2Al$ ultrafine particles by a mechanical alloying method thereby obtaining a $Nb_3Al$ group superconducting precursory composition, fabricating said $Nb_3Al$ group superconducting precursory composition to a linear body, burying a plurality of said linear bodies into an aluminum alloy matrix, inserting said aluminum alloy matrix with said buried linear bodies into a metallic tube, deforming said metallic tube with said inserted matrix and linear bodies, and subsequently, performing a diffusion reaction at 1000°–1800° C.

4. A method for manufacturing $Nb_3Al$ group superconductor comprising the steps of;

dispersing and mixing Nb particles and $Nb_2Al$ ultrafine particles by a mechanical alloying method thereby obtaining a $Nb_3Al$ group superconducting precursory composition, fabricating said $Nb_3Al$ group superconducting precursory composition to a foil, laminating said foil with an aluminum alloy foil to form a laminate, winding up said laminate to be a roll so that its cross section forms a spiral, inserting said roll into a metallic tube, deforming said metallic tube with said inserted roll, and subsequently, performing a diffusion reaction at 1000°–1800° C.

* * * * *